(12) United States Patent
Watanabe

(10) Patent No.: US 8,243,512 B2
(45) Date of Patent: Aug. 14, 2012

(54) SEMICONDUCTOR MEMORY WRITE METHOD

(75) Inventor: Yoshihisa Watanabe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 351 days.

(21) Appl. No.: 12/621,913

(22) Filed: Nov. 19, 2009

(65) Prior Publication Data

US 2010/0124113 A1 May 20, 2010

(30) Foreign Application Priority Data

Nov. 20, 2008 (JP) .................... 2008-296865

(51) Int. Cl.
*G11C 16/04* (2006.01)
*G11C 7/10* (2006.01)
*G11C 7/00* (2006.01)

(52) U.S. Cl. ......... 365/185.03; 365/185.18; 365/189.06; 365/205

(58) Field of Classification Search ............ 365/185.03, 365/185.18, 185.24, 189.06, 205
See application file for complete search history.

(56) References Cited

U.S. PATENT DOCUMENTS

| | | | | |
|---|---|---|---|---|
| 6,496,418 B2 * | 12/2002 | Kawahara et al. | ....... | 365/185.24 |
| 7,257,032 B2 * | 8/2007 | Fujiu et al. | ............. | 365/185.24 |
| 7,405,975 B2 * | 7/2008 | Hosono | .................... | 365/185.17 |
| 7,529,131 B2 | 5/2009 | Iwai et al. | | |
| 2007/0242527 A1 * | 10/2007 | Shibata | .................... | 365/189.01 |
| 2008/0049508 A1 | 2/2008 | Iwai et al. | | |
| 2009/0154241 A1 | 6/2009 | Iwai et al. | | |

FOREIGN PATENT DOCUMENTS

JP 2006-228394 8/2006

OTHER PUBLICATIONS

U.S. Appl. No. 12/885,911, filed Sep. 20, 2010, Watanabe.

* cited by examiner

*Primary Examiner* — Hoai V Ho
*Assistant Examiner* — Tri Hoang
(74) *Attorney, Agent, or Firm* — Oblon, Spivak, McClelland, Maier & Neustadt, L.L.P.

(57) ABSTRACT

A semiconductor memory write method which, when writing data at a threshold voltage level in a memory cell, is configured to perform two write operations including a preliminary data write operation of writing temporary data at a threshold voltage level lower than that of the data at the threshold voltage level, and a final data write operation of additionally writing final data at the threshold voltage level, includes making at least one of a write time of the preliminary data write operation, a word-line waiting time of verify read, and a bit-line waiting time of verify read, shorter than that of the final data write operation.

17 Claims, 7 Drawing Sheets

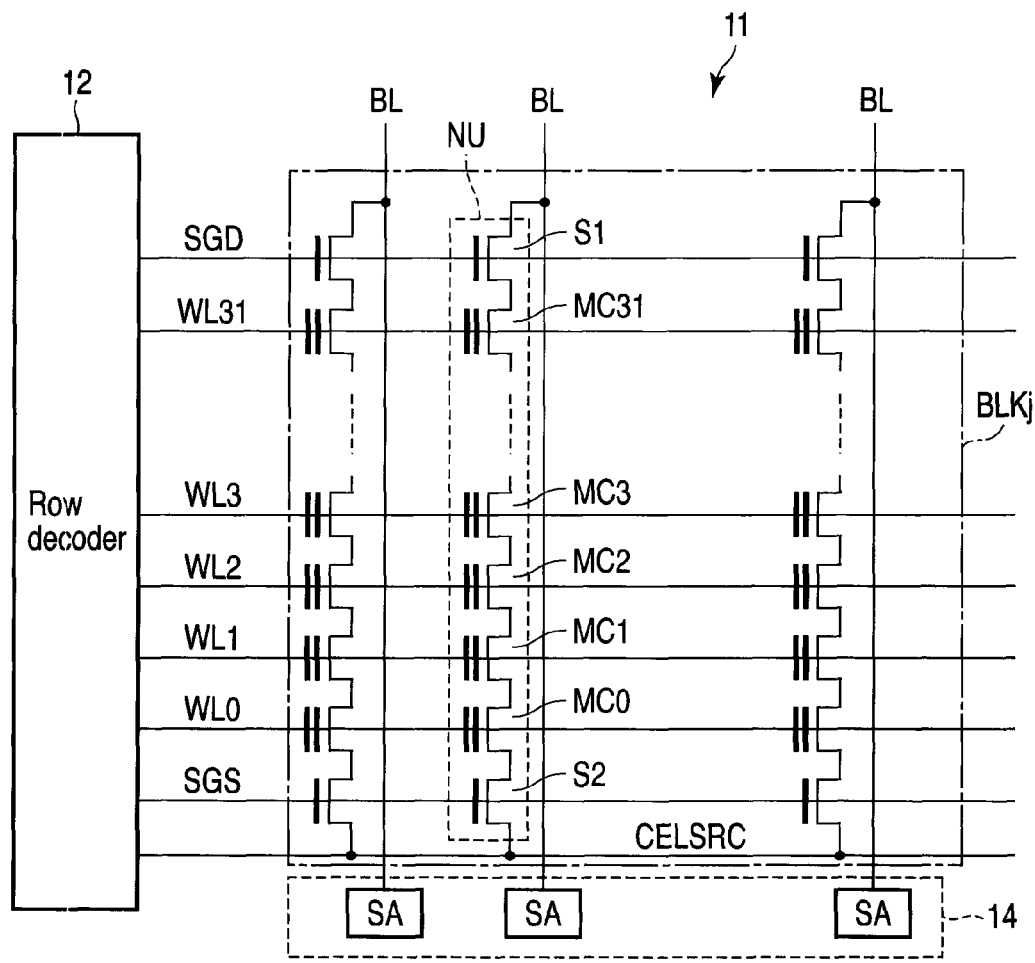
F I G. 2

SEMICONDUCTOR MEMORY WRITE METHOD

CROSS-REFERENCE TO RELATED APPLICATIONS

This application is based upon and claims the benefit of priority from prior Japanese Patent Application No. 2008-296865, filed Nov. 20, 2008, the entire contents of which are incorporated herein by reference.

BACKGROUND OF THE INVENTION

1. Field of the Invention

The present invention relates to a semiconductor memory write method.

2. Description of the Related Art

A NAND flash memory (e.g., an EEPROM) is known as an electrically programmable nonvolatile semiconductor memory. In the NAND flash memory, a memory cell array is formed by arranging, in a matrix, NAND cell units in which a plurality of nonvolatile memory cells are connected in series. Therefore, the NAND flash memory has the characteristic that the unit cell area is smaller than that of, e.g., a NOR flash memory, and this facilitates increasing the capacity (the degree of integration).

In the NAND flash memory, however, the word-line (WL) resistance and bit-line (BL) resistance tend to increase owing to the narrow-width effect as the generation advances. In a read operation, therefore, it is necessary to produce no voltage level difference between the proximal end (close to a row decoder) and the distal end (far from the row decoder) of the WL and between the proximal end (close to a sense amplifier) and the distal end (far from the sense amplifier) of the BL. This very prolongs the waiting time from the start of charging of the WL and BL. Also, in a write operation, the write pulse width must be sufficiently increased so as not to produce any write speed difference between the proximal end and distal end of the WL. In the NAND flash memory as described above, the degree of integration readily increases, but the read operation time and the write operation time (write time+ verify read time) often prolong as the degree of integration increases.

For example, there is a NAND flash memory of a so-called rewrite type (see, e.g., Jpn. Pat. Appln. KOKAI Publication No. 2006-228394) in which in order to suppress the spread of the threshold (Vth) voltage distribution caused by the cell proximity effect, preliminary data write (also called rough write) is first performed at a temporary level slightly lower than a desired threshold voltage level, and then final data write (also called additional write) by which final data is rewritten at the desired threshold voltage (finish) level is performed. Since this NAND flash memory requires two write operations, the write operation time (write time+verify read time) very prolongs.

BRIEF SUMMARY OF THE INVENTION

According to an aspect of the present invention, there is provided a semiconductor memory write method which, when writing data at a threshold voltage level in a memory cell, is configured to perform two write operations including a preliminary data write operation of writing temporary data at a threshold voltage level lower than that of the data at the threshold voltage level, and a final data write operation of additionally writing final data at the threshold voltage level, comprising: making at least one of a write time of the preliminary data write operation, a word-line waiting time of verify read, and a bit-line waiting time of verify read, shorter than that of the final data write operation.

According to another aspect of the present invention, there is provided a semiconductor memory write method which, when writing data at a threshold voltage level in a memory cell, is configured to perform two write operations including a preliminary data write operation of writing temporary data at a threshold voltage level lower than that of the data at the threshold voltage level, and a final data write operation of additionally writing final data at the threshold voltage level, comprising: making a word-line waiting time of verify read performed in the preliminary data write operation shorter than that of verify read performed in the final data write operation.

According to another aspect of the present invention, there is provided a semiconductor memory write method which, when writing data at a threshold voltage level in a predetermined memory cell, is configured to perform two write operations including a preliminary data write operation of writing temporary data at a threshold voltage level lower than that of the data at the threshold voltage level, and a final data write operation of additionally writing final data at the desired threshold voltage level, comprising: making a write time of the preliminary data write operation shorter than that of the final data write operation.

BRIEF DESCRIPTION OF THE SEVERAL VIEWS OF THE DRAWING

FIG. 2 is a view showing an example of a memory cell array of the NAND flash memory according to the first embodiment;

DETAILED DESCRIPTION OF THE INVENTION

Embodiments of the present invention will be explained below with reference to the accompanying drawing. Note that the figures are exemplary views, so the dimensions, ratios, and the like in each figure are different from actual ones. Note also that the individual figures of course include portions having different dimensional relationships and/or different ratios. In particular, the embodiments to be explained below exemplarily disclose apparatuses and methods for embodying the technical idea of the present invention, and the shapes, structures, layouts, and the like of components do no specify the technical idea of the present invention. The technical idea of the present invention can be variously changed without departing from the spirit and scope of the invention.

First Embodiment

Figure 1:
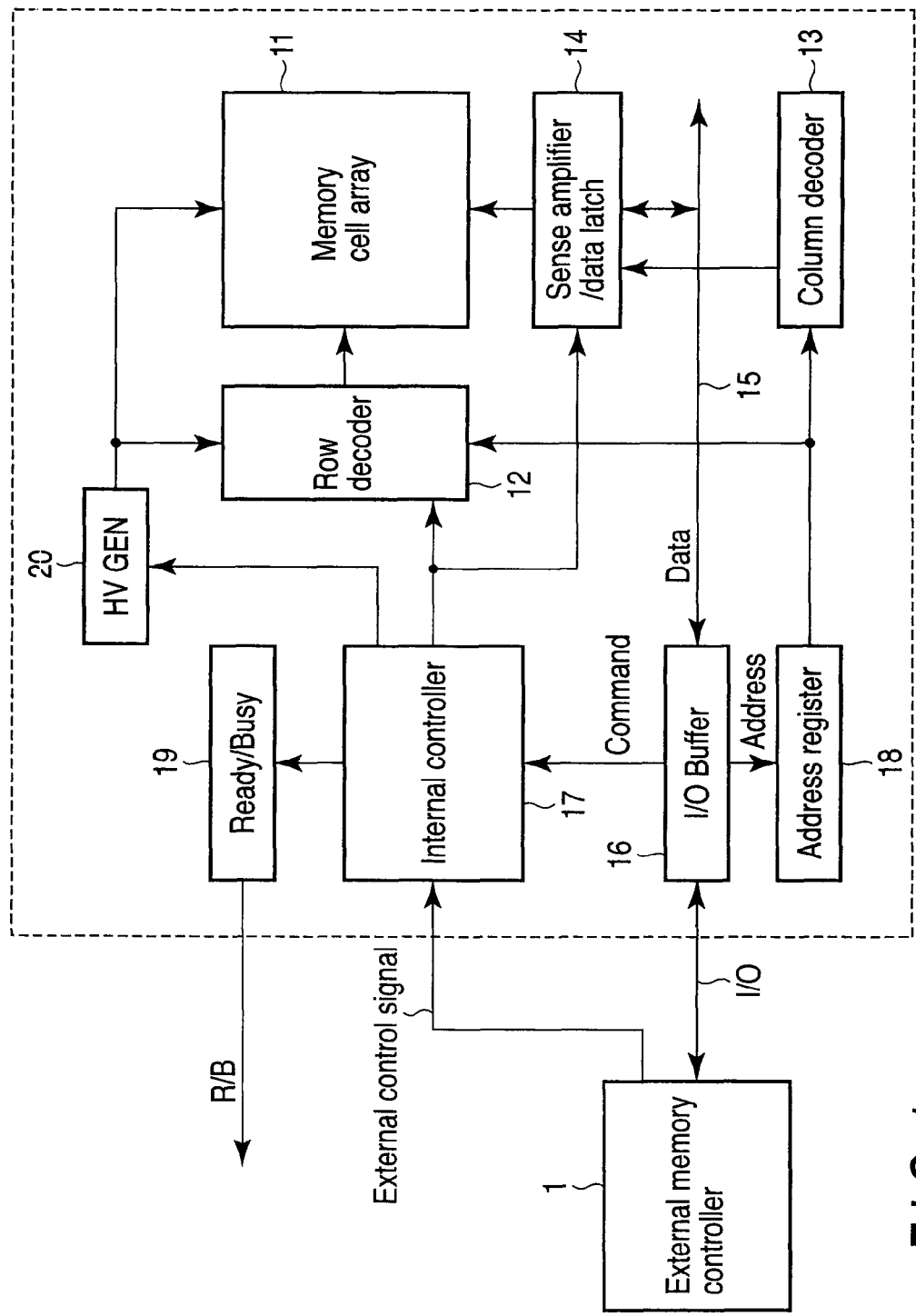
FIG. 1 is a block diagram showing a configuration example of a semiconductor memory (NAND flash memory) according to the first embodiment of the present invention.

FIG. 1 shows a configuration example (functional blocks) of a semiconductor memory according to the first embodiment of the present invention. Note that in this embodiment, a nonvolatile semiconductor memory will be explained by taking a NAND flash memory (memory chip) such as an EEPROM as an example.

As shown in, e.g., FIG. 2, a memory cell array 11 is formed by arranging a plurality of NAND cell units NU. Each NAND cell unit NU includes a plurality of (32 in FIG. 2) electrically programmable nonvolatile memory cells MC0 to MC31, and selection gate transistors S1 and S2 for connecting the two ends of the nonvolatile memory cells MC0 to MC31 to a bit line BL and source line CELSRC.

As each of the nonvolatile memory cells MC0 to MC31, a transistor formed by stacking a charge storage layer (e.g., a floating gate) and a control gate is used. Single-level data is normally stored by regarding a high threshold voltage state (positive threshold voltage state) in which electrons are injected into the floating gate as data "0", and a low threshold voltage state (negative threshold voltage state) in which electrons in the floating gate are released as data "1".

Note that when further increasing the data storage capacity, a multi-level data storage method in which one memory cell stores multi-bit data is used. For example, the following data bit allocating method has been proposed as a quaternary data storage method (see, e.g., Jpn. Pat. Appln. KOKAI Publication No. 2001-93288). That is, quaternary data is set such that A=11, B=10, C=00, and D=01 in order of threshold voltage by using 2-bit data (xy) defined by combining upper page data (upper bit data) "x" and lower page data (lower bit data) "y". This data allocating method has the advantages that it is possible to reduce the number of times of lower page read and perform high-speed write.

Referring to FIG. 2, the control gates of the memory cells MC0 to MC31 are connected to different word lines WL0 to WL31. The gates of the selection gate transistors S1 and S2 are respectively connected to selection gate lines SGD and SGS parallel to the word lines WL0 to WL31.

A set of the NAND cell units NU sharing the word lines WL0 to WL31 forms a block BLKj as a data erase unit. Although FIG. 2 shows one block BLKj as a representative, a plurality of blocks are normally arranged in the direction of the bit lines BL.

As shown in FIG. 1, a row decoder 12 selects word lines of the memory cell array 11, and a column decoder 13 selects bit lines of the memory cell array 11. A sense amplifier circuit 14 including a data latch is connected to the bit lines BL of the memory cell array 11, and reads out data or holds write data.

In a data read operation, data read out to the sense amplifier circuit 14 is supplied to an I/O buffer 16 through a data bus 15, and output from an external input/output terminal I/O to an external memory controller 1. In a data write operation, write data supplied from the external memory controller 1 to the external input/output terminal I/O is loaded from the I/O buffer 16 to the sense amplifier circuit 14 through the data bus 15.

A command supplied from the external input/output terminal I/O to the I/O buffer 16 is decoded by an internal controller 17, and the address is transferred to the row decoder 12 and column decoder 13 via an address register 18. Based on an external control signal and command supplied in accordance with an operation mode, the internal controller 17 controls sequences for data write and erase, and controls data read.

A ready/busy signal R/B indicating whether the chip is in a read state (Ready) or a busy state (Busy) is set in a status register 19, and the status register 19 outputs the ready/busy signal R/B outside the chip. A high-voltage generator (HV GEN) 20 generates various high voltages higher than the power supply voltage in accordance with operation modes. The internal controller 17 controls the high-voltage generator 20.

In the configuration of the memory cell array 11 shown in FIG. 2, sense amplifiers SA are arranged in one-to-one correspondence with the bit lines BL. In this arrangement, a set of memory cells arranged along one word line forms one page as a data read/write unit in a single-level data storage method. In a quaternary data storage method in which one memory cell stores two bits, a set of memory cells arranged along one word line forms two pages. In an actual flash memory in which cells are downsized, however, it is difficult to arrange the sense amplifiers SA at the bit-line pitch as shown in FIG. 2. In addition, the influence of noise between adjacent bit lines increases.

Figure 3:
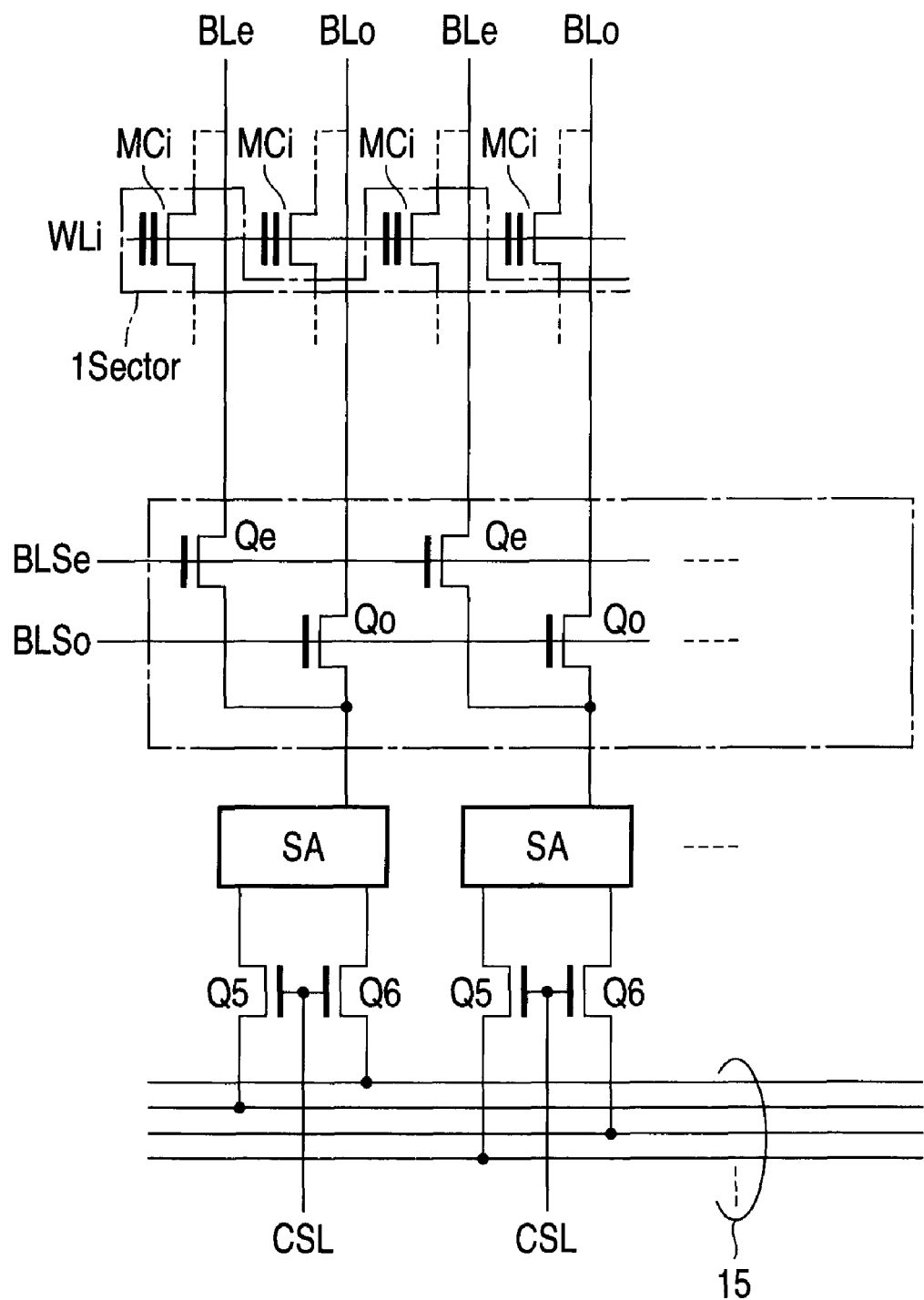
FIG. 3 is a schematic view showing a sense amplifier circuit of the NAND flash memory according to the first embodiment by taking a shared sense amplifier method as an example.

Accordingly, as shown in FIG. 3, a shared sense amplifier method in which an even-numbered bit line BLe and odd-numbered bit line BLo adjacent to each other share one sense amplifier (sense unit) SA is normally used. In this shared sense amplifier method, bit-line selection transistors Qe and Qo are arranged between even- and odd-numbered bit lines BLe and BLo corresponding to each sense amplifier SA, one of the even- and odd-numbered bit lines BLe and BLo is connected to the sense amplifier SA, and the other is used as a shield line.

When using this shared sense amplifier method, a set of memory cells MCi selected by one word line WLi and all even-numbered bit lines BLe forms one sector, and a set of memory cells MCi selected by the same word line WLi and all odd-numbered bit lines BLo forms another sector. One sector forms one page as a read/write unit in the single-level data storage method, and forms two pages (an upper page and lower page) in the quaternary data storage method.

Figure 4:
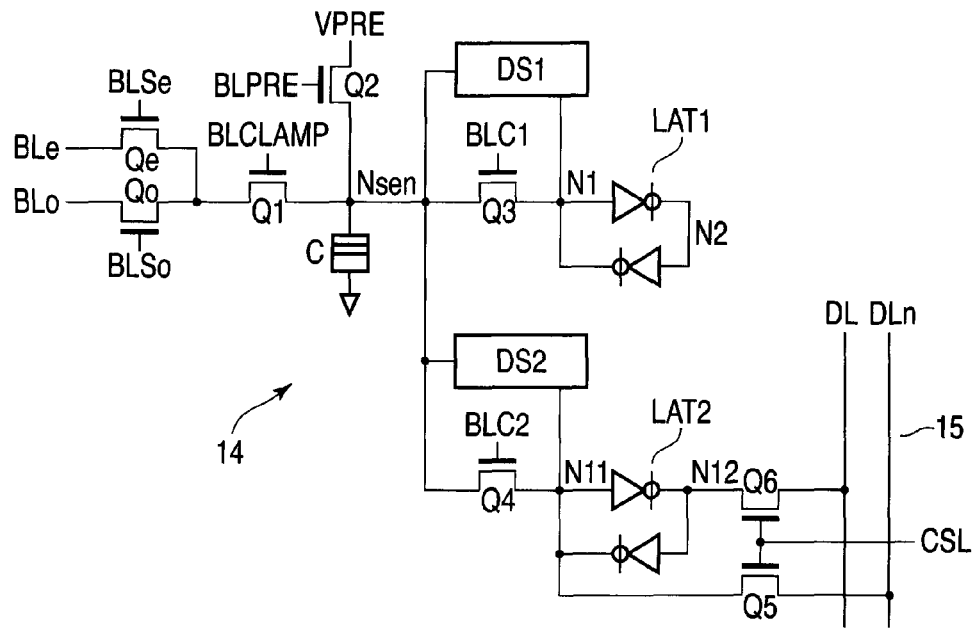
FIG. 4 is a circuit diagram showing a configuration example of a sense unit in the sense amplifier circuit of the NAND flash memory according to the first embodiment.

FIG. 4 shows a configuration example of one sense unit SA connected to a pair of bit lines BLe and BLo in the sense amplifier circuit 14. A sense node Nsen is connected to one of the bit lines BLe and BLo via an NMOS transistor Q1 and the bit-line selection transistors Qe and Qo. In a data read operation, the transistor Q1 performs an operation of clamping the bit-line voltage, and functions as a pre-sense amplifier for detecting a bit-line voltage corresponding to cell data (read data). In a data write operation, the transistor Q1 performs an operation of transferring a voltage corresponding to write data to the bit lines BLe and BLo.

A precharge NMOS transistor Q2 is connected to the sense node Nsen. In a data read operation, the precharge NMOS transistor Q2 precharges the bit lines BLe and BLo to a predetermined voltage.

Two data storage circuits (data latches) LAT1 and LAT2 are respectively connected to the sense node Nsen via transfer NMOS transistors Q3 and Q4. The data latches LAT1 and LAT2 are selectively used in accordance with operation modes. For example, the data latch LAT2 forms a data cache for exchanging read data and write data with the external input/output terminal I/O. Therefore, data nodes N11 and N12 of the data latch LAT2 are respectively connected to data lines DL and DLn of the data bus 15 via column gate transistors Q5 and Q6. Accordingly, read/write data of one page is serially transferred between the sense amplifier circuit 14 and external input/output terminal I/O for each column (every 8 or 16 bits).

In a data write operation, write data is loaded on the data latch LAT2, and then transferred to and held in the data latch LAT1. The data write operation is performed by repeating a write cycle including write voltage application and verify read for checking the written state.

In each write cycle, write verify is performed for each bit, and write data for the next write cycle is determined. For this purpose, a data storage circuit DS1 for temporarily storing write data is formed between a data node N1 of the data latch LAT1 and the sense node Nsen.

The write operation will briefly be explained below. Write data of the data latch LAT1 is set as N1="L" when the write data is data "0" for which the cell threshold voltage is to be moved in the positive direction, and set as N1="H" when the write data is data "1" (i.e., write inhibit) for which the cell threshold voltage is to be held in a negative state (erased state).

In write verify read (verify read), a "verify voltage" corresponding to the lower limit of a data threshold voltage distribution to be checked is applied to a selected word line to detect whether to discharge a precharged bit line by a selected cell. A cell in which data "0" is written is not turned on by the verify voltage applied to the word line, so the bit line is not discharged. Accordingly, the written data is read out as data by which Nsen="H", and "1" write (write inhibit) is set after that. By contrast, in a cell in which data "0" is insufficiently written or data "1" is written, the bit line is discharged, and the written data is read out as data "L". In the next write cycle, therefore, based on write data of the preceding cycle held by the data storage circuit DS1, write data "1" is written as data "H" in the data latch LAT1 again.

When write data "0" in one page are written in all cells, the data latch LAT1 is controlled to set the data node N1 in an all-"H" (all-"1"s) state. By detecting this all-"1" state of the data latch LAT1, the completion of one-page write is determined. FIG. 4 does not show this verify determination circuit.

Although FIG. 4 shows an example in which the data latch LAT2 also has a data storage circuit DS2, the data storage circuit DS2 is unnecessary in some cases. Also, the quaternary data storage method requires lower page write and upper page write as data write. In addition, the upper page write requires different write verify read operations having different verify conditions for checking the two data states. In this upper page write sequence, write verify read must be performed by referring to already written lower page data. During the upper page write, therefore, the data latch LAT2 holds lower page data read out from the memory cell array.

Figure 5:
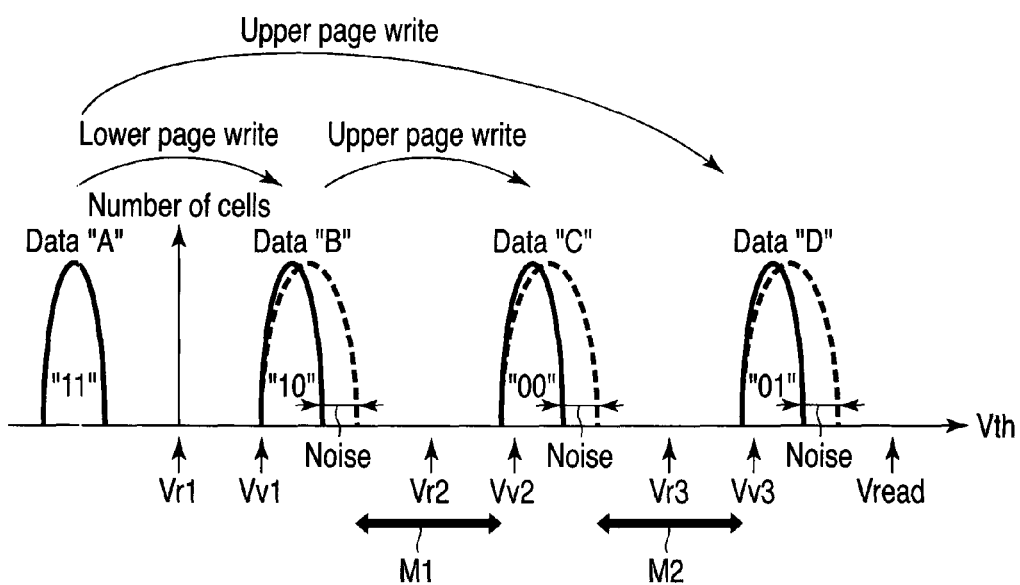
FIG. 5 is a view showing the data threshold voltage distribution of the NAND flash memory according to the first embodiment by taking four levels data (a quaternary data) storage method as an example.

FIG. 5 shows an example of the data threshold voltage distribution when using the quaternary data storage method. Quaternary data A, B, C, and D are defined in order of threshold voltage. Assuming that quaternary data is represented by "xy" by using upper page data "x" and lower page data "y", a data bit allocation method by which A=11, B=10, C=00, and D=01 is used. Data "A" is an erased state (i.e., a negative threshold voltage) in which the threshold voltage is lowest.

Data is erased for each block. While all the word lines of a selected block are set at 0 V, an erase voltage Vera (e.g., 20 V) is applied to a p-type well in which the memory cell array is formed. Consequently, all the memory cells in the selected block are set in the negative threshold voltage state (data "A") because electrons are released from the floating gates.

As shown in FIG. 5, the data write operation requires lower page write and upper page write. The lower page write is an operation of selectively changing a data "A" cell into data "B". Write data to be loaded on the data latch LAT1 is "0" (the write of data "B") or "1" (the maintenance of data "A", i.e., write inhibit). In accordance with this write data "0" or "1", the potential of the NAND cell channel is set at Vss or Vdd−Vt (Vt is the threshold voltage of the selection gate transistors S1 and S2) via the bit line. When a write voltage Vpgm is applied to the selected word line, an electron injecting operation occurs in a cell to which data "0" is given, and no electron injecting operation occurs in a cell to which data "1" is given. This makes it possible to selectively raise the threshold voltages of cells in the same page.

The write verify read of each write cycle uses a verify voltage Vv1 set at the lower limit of the threshold voltage distribution of data "B".

The upper page write includes first upper page write that selectively changes a data "B" cell into data "C", and second upper page write that selectively changes a data "A" cell into data "D". These two types of upper page write are performed in one sequence by selectively giving write data "0" and "1" to selected pages, and simultaneously applying the write voltage. That is, the first and second upper page write operations are simultaneously performed as "0" write operations.

Note that write verify read operations of the two types of upper page write are performed in different steps because it is necessary to use different verify voltages. That is, the first upper page write uses a verify voltage Vv2, and the second upper page write uses a verify voltage Vv3.

In the write verify read of the first upper page write, it is necessary to check the write state of only data "C" and exclude data "D" from verify objects. This is done by referring to already written lower page write data. That is, before the start of the upper page write, a read voltage for giving lower page write data "A" and "B" to the word line is set at Vr1, and data "1" and "0" are read out and held in the data latch LAT2. Although a detailed explanation of the operation will be omitted, data "D" can be excluded from verify objects by using this data held in the data latch LAT2 in the write verify read of the first upper page write.

In the second upper page write using the verify voltage Vv3, data "C" is read out as data "1", so the write state of data "D" alone can be checked without referring to the lower page write data.

In a normal data read operation, upper page read is performed once, and lower page read is performed twice. First, the upper page read is performed using a read voltage Vr2 set between the threshold voltage distributions of data "B" and "C". Consequently, data "A" or "B" for which upper page write data "x" is "1" is read out as data "1", and data "C" or "D" for which upper page write data "x" is "0" is read out as data "0".

Then, the first lower page read using the read voltage Vr1 set between data "A" and "B" and the second lower page read using a read voltage Vr3 set between data "C" and "D" are sequentially performed. This makes it possible to discriminate between data "A" and "B", and between data "C" and "D".

Note that the above-mentioned read voltages Vr1 to Vr3 used in the data read operation are given to a selected word line. Unselected word lines and a selected gate line in a selected block are given a read pass voltage Vread (see FIG. 5) higher than the upper limits of all the data threshold voltage distributions. Since this makes it possible to turn on unselected cells regardless of data, the data of a selected word line can be determined by sensing whether a bit-line current flows by the data. Note that the read pass voltage Vread is also used in verify read.

The arrangement and basic operations of the NAND flash memory using the rewrite method have been explained so far. In the following description, a write method capable of shortening the write operation time that prolongs owing to the narrow-width effect of a word line and bit line in an actual data write operation will be explained in detail.

In this embodiment, preliminary data write (rough write) by which a threshold voltage state (preliminary data at a temporary level) lower than a desired threshold voltage is selectively written in first memory cells arranged along the word line is performed, and write verify read of this preliminary data write is temporarily performed. After that, final data write (additional write) by which a desired threshold voltage state (final data at a finish level) is selectively written in the first memory cells by using the same data pattern as that of the preliminary data write is performed, and write verify read of this final data write is normally performed. That is, the preliminary data of the preliminary data write need not accurately be written because the data is not read out. Therefore, the write verify read of the preliminary data write can temporarily be performed.

Accordingly, to produce no voltage level difference between the proximal end (close to the row decoder) and the distal end (far from the row decoder) of a word line in the write verify read of the preliminary data write, the waiting time before the potential of the word line stabilizes is made shorter than that of a normal operation, i.e., the write verify read of the final data write. Since this makes it possible to shorten the verify read time of the preliminary data write, the write speed can be increased.

Figure 6:
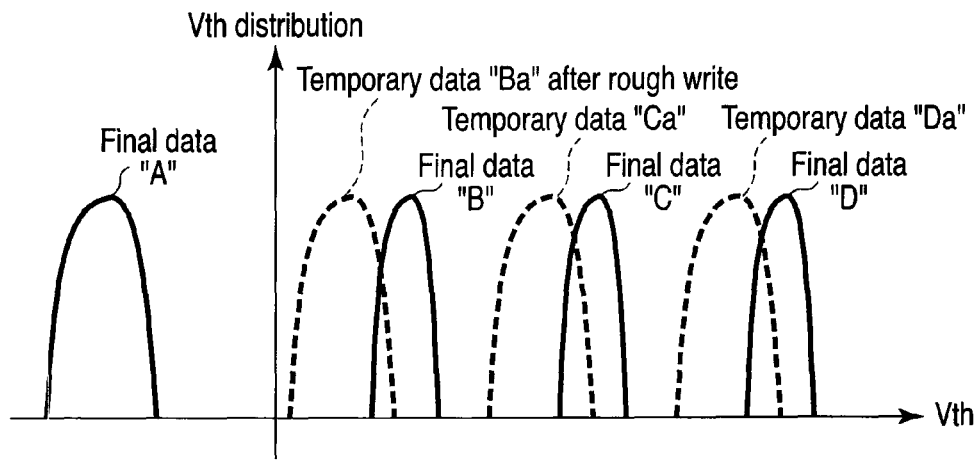
FIG. 6 is a view for explaining a data write operation when using a write method capable of shortening the write operation time in the NAND flash memory according to the first embodiment.

FIG. 6 shows a data write operation when using the write method capable of shortening the write operation time according to this embodiment. Note that the operation will be explained below by taking the quaternary data storage method as an example.

Referring to FIG. 6, "Ba" is temporary data after rough write (preliminary data write) of data (final data) "B", "Ca" is temporary data of data "C", and "Da" is temporary data of data "D". Note that temporary data of final data "A" is "A" (for example, final data "A" is written as temporary data "A" in the preliminary data write).

Figure 7A:
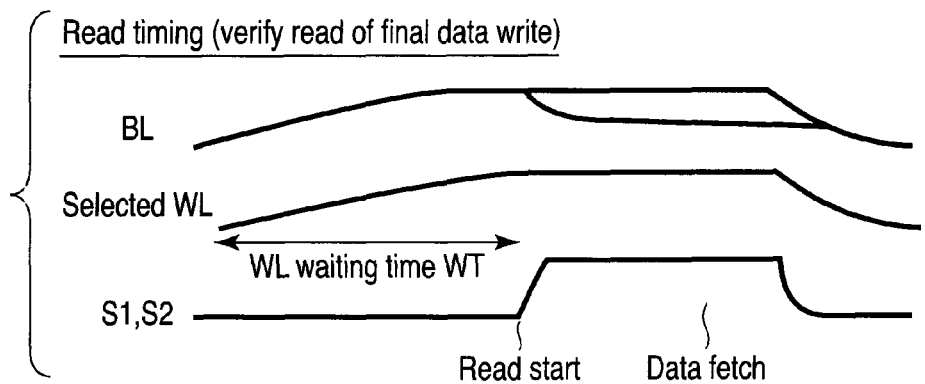
FIGS. 7A and 7B are timing charts for explaining a data write operation when using the write method capable of shortening the write operation time in the NAND flash memory according to the first embodiment.

As shown in FIG. 7A, for example, in the verify read (read timing) of final data "A", "B", "C", and "D", a waiting time (from the start of charging of a word line to the start of read) WT before the potential of the selected word line WL stabilizes is set sufficiently long so as not to produce any voltage level difference between the proximal end and distal end of the selected word line WL. That is, charging operations of the selected word line WL and bit line BL are started almost simultaneously. After the potentials of the selected word line WL and bit line BL well stabilize (after the elapse of the WL waiting time WT), the potentials of the selection gate transistors S1 and S2 are raised to start reading out final data "A", "B", "C", and "D".

Figure 7B:
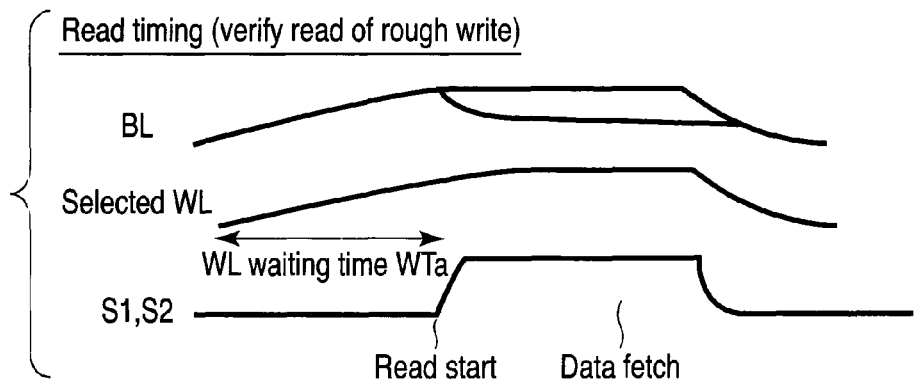

By contrast, in the verify read of temporary data "A", "Ba", "Ca", and "Da" as shown in, e.g., FIG. 7B, a waiting time WTa before the potential of the selected word line WL stabilizes is set shorter than the waiting time WT in the verify read of final data "A", "B", "C", and "D" (WTa<WT). In this case, although charging operations of the selected word line WL and bit line BL are started almost simultaneously, the potentials of the selection gate transistors S1 and S2 are raised to start reading out temporary data "A", "Ba", "Ca", and "Da" before the potential of the selected word line WL well stabilizes (after the elapse of the WL waiting time WTa).

As described above, in the write method (rewrite method) requiring two data write operations, the selected word line waiting time WTa in the write verify read of the preliminary data write is made shorter than the selected word line waiting time WT in the write verify read of the final data write. This makes it possible to shorten the verify read time of the preliminary data write in the data write operation time. Consequently, even in a NAND flash memory in which the selected word line waiting time is set long owing to the narrow-width effect of a word line, it is possible to increase the write speed, and shorten the data write operation time (write time+verify read time).

If, however, the selected word line waiting time WTa in the write verify read of the preliminary data write is shortened too much, the effect of canceling the cell proximity effect reduces. That is, while the distal end of the word line WL is overshooting, the word line WL does not become a verify pass unless the cell changes to a high level. However, if the potential of the word line WL is lower than the finish level (final data), the word line WL becomes a verify pass even when the cell is at a low level. To prevent this inconvenience, therefore, it is also possible to, e.g., make the selected word line waiting time WTa variable in the write verify read of the preliminary data write, and always give an optimum value to the waiting time WTa in accordance with the setting of various parameters, the setting data of a ROM Fuse (not shown), or the like.

Second Embodiment

Figure 8A:
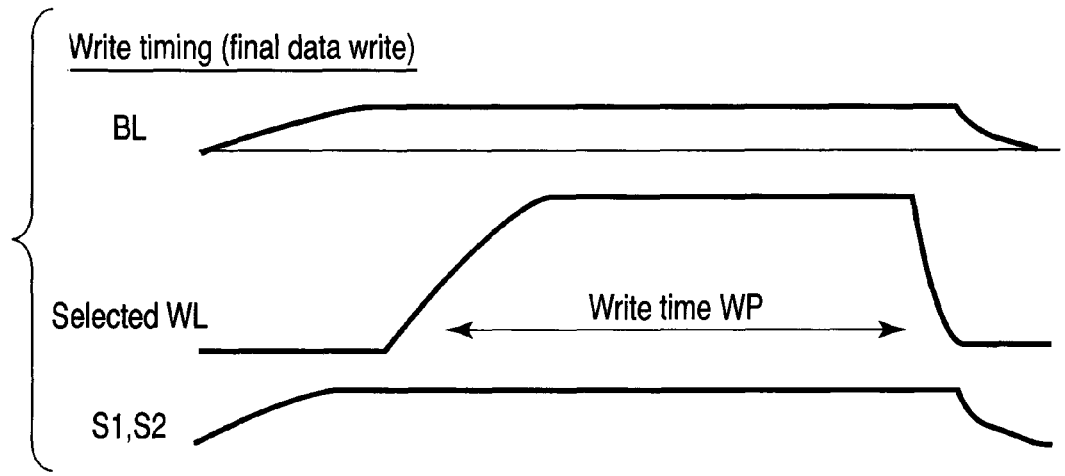
FIGS. 8A and 8B are timing charts for explaining a data write operation when using a write method capable of shortening the write operation time in a NAND flash memory according to the second embodiment of the present invention.
Figure 8B:
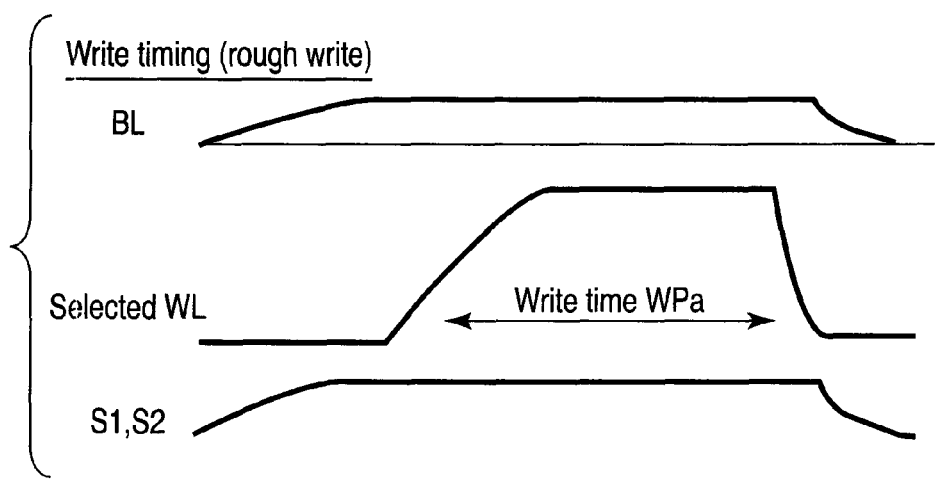

FIGS. 8A and 8B illustrate a data write operation when using a write method capable of shortening the write operation time according to the second embodiment of the present invention. This operation will be explained by taking, as an example, a case in which the write pulse width of preliminary data write is decreased in order to shorten the data write operation time. Note that the same reference numerals as in the above-mentioned first embodiment denote the same parts, and a repetitive explanation will be omitted.

In this embodiment, in the write operation (write timing) of final data "A", "B", "C", and "D" shown in FIG. 6, a write pulse width (write time) WP is set sufficiently long as shown in, e.g., FIG. 8A. That is, the potentials of a bit line BL and selection gate transistors S1 and S2 are raised almost simultaneously, and a predetermined write voltage Vpgm is applied to a selected word line WL when the potentials of the bit line BL and selection gate transistors S1 and S2 well stabilize. After that (after the elapse of the sufficient write time Wp), the potentials of the bit line BL, selected word line WL, and selection gate transistors S1 and S2 are lowered almost simultaneously. In this manner, final data "A", "B", "C", and "D" are written in memory cells.

By contrast, in a write operation of temporary data "A", "Ba", "Ca", and "Da", a write pulse width (write time) WPa is set shorter than the write pulse width WP of final data "A", "B", "C", and "D" (WPa<WP). In this case, the predetermined write voltage Vpgm is applied to the selected word line WL, but the potentials of the bit line BL, selected word line WL, and selection gate transistors S1 and S2 are lowered almost simultaneously before the sufficient write time WP is reached (after the elapse of the write time WPa). In this way, temporary data "A", "Ba", "Ca", and "Da" are written in memory cells.

As described above, it is possible to increase the write speed and shorten the data write operation time (write time+ verify read time) by controlling the write timing of rough write, i.e., by making the write pulse WPa of the preliminary data write shorter than the write pulse width WP of the final data write.

Third Embodiment

Figure 9A:
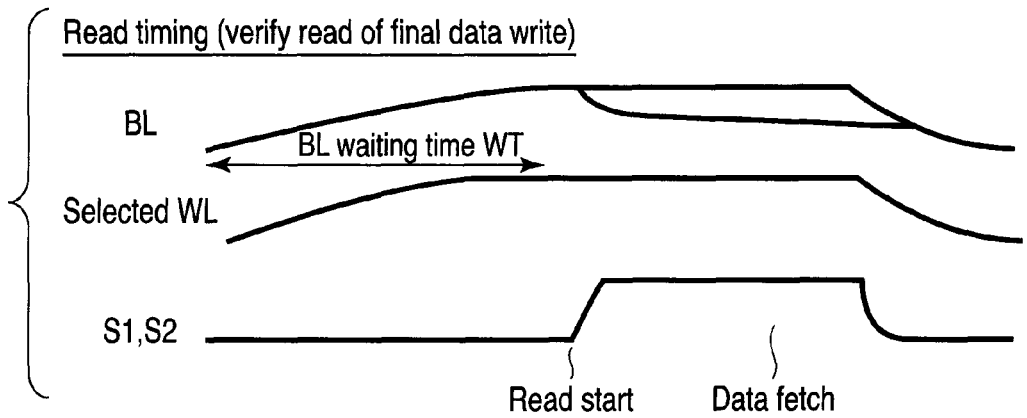
FIGS. 9A and 9B are timing charts for explaining a data write operation when using a write method capable of shortening the write operation time in a NAND flash memory according to the third embodiment of the present invention.
Figure 9B:
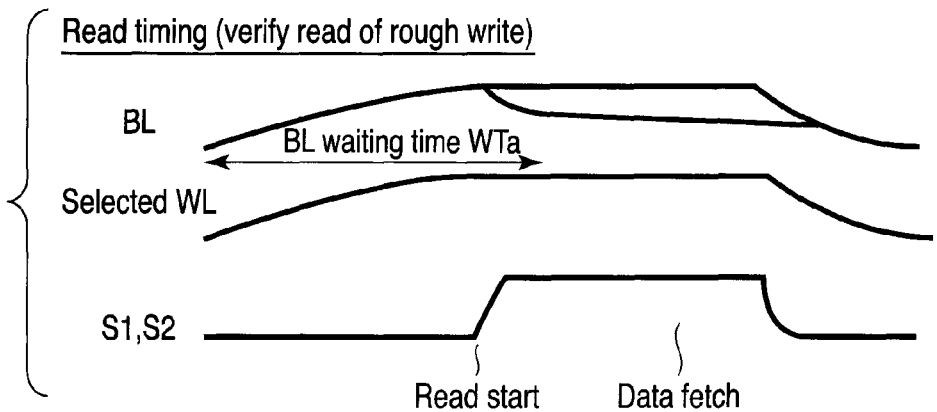

FIGS. 9A and 9B illustrate a data write operation when using a write method capable of shortening the write operation time according to the third embodiment of the present invention. This operation will be explained by taking, as an example, a case in which the bit-line waiting time (BL charge/discharge time) of write verify read of preliminary data write is shortened in order to shorten the data write operation time. Note that the same reference numerals as in the above-mentioned first embodiment denote the same parts, and a repetitive explanation will be omitted.

In this embodiment, in the verify read (read timing) of final data "A", "B", "C", and "D" shown in FIG. 6, a waiting time (from the start of charging of a bit line to the start of read) WT before the potential of a bit line BL stabilizes is set sufficiently long so as not to produce any voltage level difference between the proximal end and distal end of the bit line BL as shown in, e.g., FIG. 9A. That is, charging operations of a selected word line WL and the bit line BL are started almost simultaneously. After the potentials of the selected word line WL and bit line BL well stabilize (after the elapse of the BL waiting time WT), the potentials of selection gate transistors S1 and S2 are raised to start reading out final data "A", "B", "C", and "D".

By contrast, in the verify read of temporary data "A", "Ba", "Ca", and "Da", a waiting time WTa before the potential of the bit line BL stabilizes is set shorter than the waiting time WT of the verify read of final data "A", "B", "C", and "D" (WTa<WT). In this case, charging operations of the selected word line WL and bit line BL are started almost simultaneously, but the potentials of the selection gate transistors S1 and S2 are raised to start reading out temporary data "A", "Ba", "Ca", and "Da" before the potential of the bit line BL well stabilizes (after the elapse of the BL waiting time WTa).

As described above, it is possible to increase the write speed and shorten the data write operation time (write time+ verify read time) by controlling the read timing of rough write, i.e., by making the BL waiting time WTa of the write verify read of the preliminary data write shorter than the BL waiting time WT of the write verify read of the final data write.

Note that in each embodiment described above, preliminary data write by which the rough write of temporary data is performed before final data is written has been explained by taking the quaternary data storage method as an example of a write method requiring two data write operations.

Figure 10:
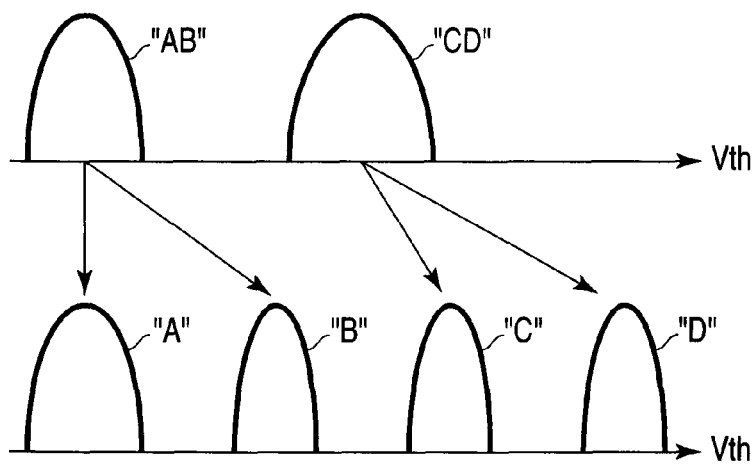
FIG. 10 is a view for explaining another data write operation by taking the quaternary data storage method as an example.

The present invention, however, is not limited to this. For example, as shown in FIG. 10, the present invention is also applicable to a method of temporarily writing single-level data (temporary data) "AB" and "CD" as preliminary data write, and finally writing quaternary data (final data) "A", "B", "C", and "D" after that.

Note also that each embodiment is not limited to the quaternary data storage method, and also applicable to various data storage methods such as single-level data, eight levels data (octonary data), and sixteen levels data (hexadecimal data) storage methods.

The present invention is not limited to a NAND flash memory requiring two data write operations, and can also be applied to a memory capable of two data write operations.

As described above, the first to third embodiments can individually achieve the satisfactory effects, but the effects can further be enhanced by combining some embodiments. For example, when combining the first and second embodiments, it is possible to shorten the WL waiting time of the write verify time of preliminary data write and the write time of preliminary data write. Accordingly, the data write operation time can be made shorter than that when the first or second embodiment alone is performed. Also, when combining, e.g., the second and third embodiments, it is possible to shorten the write time of preliminary data write and the BL waiting time of the write verify read of preliminary data write. Therefore, the data write operation time can be made shorter than that when the second or third embodiment alone is performed.

Furthermore, the above embodiments include the following modes.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory write method which, when writing data at a threshold voltage level in a memory cell, is configured to perform two write operations including a preliminary data write operation of writing temporary data at a threshold voltage level lower than that of the data at the threshold voltage level, and a final data write operation of additionally writing final data at the threshold voltage level, comprising:

making at least one of a write time of the preliminary data write operation, a word-line waiting time of verify read, and a bit-line waiting time of verify read, shorter than that of the final data write operation.

2. The method according to claim 1, wherein shortening the write time of the preliminary data write operation comprises shortening a write pulse width to be applied to a word line in order to write the temporary data.

3. The method according to claim 1, wherein shortening the word-line waiting time of verify read performed in the preliminary data write operation comprises shortening a waiting time from the start of charging of a selected word line to the start of the verify read, in order to produce no voltage level difference between a proximal end and distal end of the selected word line.

4. The method according to claim 1, wherein shortening the bit-line waiting time of verify read performed in the preliminary data write operation comprises shortening a waiting time from the start of charging of a bit line to the start of the verify read, in order to produce no voltage level difference between a proximal end and distal end of the bit line.

5. The method according to claim 1, wherein a multi-level data storage method by which one memory cell stores multi-bit data is used.

6. The method according to claim 1, wherein the semiconductor memory includes a sense amplifier which senses read data of the memory cell and holds write data.

7. The method according to claim 6, wherein the sense amplifier includes at least a transistor which performs an operation of clamping a bit-line voltage and functions as a pre-sense amplifier which detects a bit-line voltage corresponding to cell data in the verify read operation, and performs an operation of transferring a voltage corresponding to write data to the bit line in the preliminary data write operation.

8. A semiconductor memory write method which, when writing data at a threshold voltage level in a memory cell, is configured to perform two write operations including a preliminary data write operation of writing temporary data at a threshold voltage level lower than that of the data at the threshold voltage level, and a final data write operation of additionally writing final data at the threshold voltage level, comprising:

making a word-line waiting time of verify read performed in the preliminary data write operation shorter than that of verify read performed in the final data write operation.

9. The method according to claim 8, wherein shortening the word-line waiting time of the verify read performed in the preliminary data write operation comprises shortening a waiting time from the start of charging of a selected word line to the start of the verify read, in order to produce no voltage level difference between a proximal end and distal end of the selected word line.

10. The method according to claim 8, wherein a multi-level data storage method by which one memory cell stores multi-bit data is used.

11. The method according to claim 8, wherein the semiconductor memory includes a sense amplifier which senses read data of the memory cell and holds write data.

12. The method according to claim 11, wherein the sense amplifier includes at least a transistor which performs an operation of clamping a bit-line voltage and functions as a pre-sense amplifier which detects a bit-line voltage corresponding to cell data in the verify read operation, and performs an operation of transferring a voltage corresponding to write data to the bit line in the preliminary data write operation.

13. A semiconductor memory write method which, when writing data at a threshold voltage level in a predetermined memory cell, is configured to perform two write operations including a preliminary data write operation of writing temporary data at a threshold voltage level lower than that of the data at the threshold voltage level, and a final data write operation of additionally writing final data at the desired threshold voltage level, comprising:

making a write time of the preliminary data write operation shorter than that of the final data write operation.

14. The method according to claim 13, wherein shortening the write time of the preliminary data write operation comprises shortening a write pulse width to be applied to a word line in order to write the temporary data.

15. The method according to claim 13, wherein the multi-level data storage method by which one memory cell stores multi-bit data is used.

16. The method according to claim 13, wherein the semiconductor memory includes a sense amplifier which senses read data of the memory cell and holds write data.

17. The method according to claim 16, wherein the sense amplifier includes at least a transistor which performs an operation of transferring a voltage corresponding to write data to the bit line in the preliminary data write operation.

* * * * *